(12) United States Patent
Sadeghian Marnani

(10) Patent No.: US 10,663,874 B2
(45) Date of Patent: May 26, 2020

(54) ALIGNMENT SYSTEM AND METHOD

(71) Applicant: Nederlandse Organisatie voor toegepast-natuurwetenschappelijk onderzoek TNO, 's-Gravenhage (NL)

(72) Inventor: Hamed Sadeghian Marnani, 's-Gravenhage (NL)

(73) Assignee: NEDERLANDSE ORGANISATIE VOOR TOEGEPAST-NATUURWETENSCHAPPELIJK ONDERZOEK TNO, 'S-Gravenhage (NL)

( * ) Notice: Subject to any disclaimer, the term of this patent is extended or adjusted under 35 U.S.C. 154(b) by 0 days.

(21) Appl. No.: 15/775,171

(22) PCT Filed: Nov. 10, 2016

(86) PCT No.: PCT/NL2016/050780
§ 371 (c)(1),
(2) Date: May 10, 2018

(87) PCT Pub. No.: WO2017/082725
PCT Pub. Date: May 18, 2017

(65) Prior Publication Data
US 2019/0250524 A1  Aug. 15, 2019

(30) Foreign Application Priority Data
Nov. 11, 2015 (EP) .................... 15194135

(51) Int. Cl.
*G03F 7/20* (2006.01)
*G03F 9/00* (2006.01)
(Continued)

(52) U.S. Cl.
CPC .......... *G03F 9/7065* (2013.01); *G01Q 20/02* (2013.01); *G01Q 40/00* (2013.01); *G01Q 60/24* (2013.01);
(Continued)

(58) Field of Classification Search
CPC .......... G03F 7/20; G03F 1/36; G03F 7/70775; G03F 1/42; G03F 7/707; G03F 7/70716;
(Continued)

(56) References Cited

U.S. PATENT DOCUMENTS 5,324,935 A    6/1994 Yasutake
5,508,527 A    4/1996 Kuroda et al.
(Continued)

FOREIGN PATENT DOCUMENTS

WO    2014188379 A1    11/2014

*Primary Examiner* — Mesfin T Asfaw
(74) *Attorney, Agent, or Firm* — Hoffmann & Baron, LLP

(57) ABSTRACT

An alignment system (100) and method for positioning and/or keeping a first object (1) at a controlled distanced (D1) with respect to a second object (2). An object stage (11) is configured to hold a surface (1a) of the first object (1) at a distance (D1) over a surface (2a) of the second object (2). A sensor device (31) comprising a probe tip (31a) is connected at a predetermined probe level distance (Dp) relative to the surface (1a) of the first object (1). The probe tip (31a) is configured to perform an atomic force measurement (AFM) of a force (F1) exerted via the probe tip (31a) on a surface (2a) of the second object (2). A controller (80) is configured to control an object stage actuator (21) as a function of the probe level distance (Dp) and the measured force (F1) to maintain the controlled distanced (D1).

15 Claims, 8 Drawing Sheets

(51) Int. Cl.
*G01Q 20/02* (2010.01)
*G01Q 60/24* (2010.01)
*G01Q 40/00* (2010.01)
*G01Q 70/06* (2010.01)
*G01Q 30/02* (2010.01)
*G01Q 10/06* (2010.01)

(52) U.S. Cl.
CPC .......... *G03F 9/7023* (2013.01); *G03F 9/7061* (2013.01); *G01Q 10/065* (2013.01); *G01Q 30/02* (2013.01); *G01Q 70/06* (2013.01)

(58) Field of Classification Search
CPC ............. G03F 7/70825; G03F 7/70441; G03F 9/7088; G03F 7/70141; G03F 7/7035; G03F 9/7003; G03F 9/7038
See application file for complete search history.

(56) References Cited

U.S. PATENT DOCUMENTS

| | | | | |
|---|---|---|---|---|
| 5,907,405 | A | * | 5/1999 | Mizutani .................. G03F 9/70 356/399 |
| 6,097,473 | A | * | 8/2000 | Ota ...................... G03F 9/7061 355/53 |
| 7,021,120 | B2 | | 4/2006 | Carter et al. |

* cited by examiner

ALIGNMENT SYSTEM AND METHOD

This application is the U.S. National Phase of, and Applicant claims priority from, International Patent Application Number PCT/NL2016/050780 filed 10 Nov. 2016, which claims priority from EP 15194135.8 filed 11 Nov. 2015, each of which is incorporated herein by reference.

TECHNICAL FIELD AND BACKGROUND

The present disclosure relates to an alignment system and method for positioning and/or keeping a first object at a controlled distanced with respect to a second object.

In nano-manufacturing and metrology, it is often desired to have an optical element accurately positioned with respect to a substrate, e.g. wafer. Typically, a measurement is done initially with a level sensor, which maps the height of a target substrate, followed by the optical element being positioned based on the level sensing measurement. For example, in a lithographic apparatus an imaging lens can be used to project an image onto a wafer. To maintain focus, it is desired to keep a controlled distance between the imaging lens and the wafer. However, at high resolutions, even minute variations in the thickness, tilting, or waviness of the wafer can have a significant influence on the focus, e.g. while moving the wafer under the lens. Accordingly, it is desired to constantly monitor and align the distance at high precision.

For example, the distance can be measured using optical means such as interferometry. However, optical techniques are typically substrate dependent, e.g. affected by the reflection behavior of the substrate material. Alternatively, capacitive sensors can be used, but they are also substrate dependent, e.g. affected by the conductivity of the substrate. Alternatively, U.S. Pat. No. 7,021,120 discloses a high resolution gas gauge proximity sensor which may be less dependent on the substrate. However, the system comprises a complicated gas system and may affect vacuum conditions. Also the resolution may still be insufficient and the system relatively slow.

For example, WO 2014/188379 A1 describes an evaluation system that comprises a solid immersion lens and multiple atomic force microscopes (AFMs) arranged to generate information indicative of a spatial relationship between the solid immersion lens and a substrate. The system comprises a location correction element and a controller arranged to receive the spatial relationship information and to send correction signals to the location correction element for introducing a desired spatial relationship between the solid immersion lens and the substrate. A supporting structure is coupled to the spatial sensors, the solid immersion lens and the at least one location correction element. Unfortunately, the relative distance between the lens and substrate cannot be accurately controlled to adapt for different circumstances.

For example, U.S. Pat. No. 5,508,527 describes a method and apparatus for detecting the relative positional displacement between a mask and a wafer. The mask is provided with a cantilever. The position mark is provided on the wafer so as to face the cantilever. A relative positional displacement between the mask and the wafer is detected from a deformation amount of the cantilever based on a force acting between the position mark and the cantilever upon relative movement of the position mark and the cantilever. Unfortunately, the relative distance between the mask and wafer cannot be easily controlled to adapt for different circumstances.

Accordingly, it is desired to provide a substrate independent alignment system to easily set and accurately maintain distance between objects at high precision.

SUMMARY

The present disclosure provides an alignment and tracking system for positioning and/or keeping a first object at a controlled distanced with respect to a second object. The system comprises an object stage configured to hold the first object or the second object, wherein a surface of the first object at a distance over a surface of the second object. The system comprises an object stage actuator configured to actuate the object stage to vary the distance between the surfaces of the first and second objects. The object stage is thus configured to move the first and/or second objects relative to each other to change the distance there between. The system comprises a sensor device. The sensor device comprises a probe tip connected at a predetermined probe level distance relative to the surface of the first object. The first object is, in use, held by the object stage. The probe tip is configured to perform an atomic force measurement of a force exerted via the probe tip on a surface of the second object. The system comprises a controller configured to control the object stage actuator as a function of the probe level distance and the measured force to keep the first object at the controlled distanced with respect to a second object.

By measuring the atomic force between the probe tip and the surface of the second object, it can be accurately determined what is the distance between the probe tip and the second object. By having the probe tip connected at a predetermined probe level distance with respect to the probe tip, it is known how far the surface of the first object is from the probe tip and thus how far it is from the surface of the second object. By controlling the object stage actuator as a function of the probe level distance and the measured probe force the distance between the first and second objects can be accurately maintained. It will be appreciated that the system employs a sensor device with a probe tip that is normally employed in atomic force microscopy (AFM). However, in the present system, the sensor device is used for another purpose and in a different manner, namely alignment of objects instead of creating a surface image. It is found that the probe tip can accurately respond to the second surface. Microscopic variations in the surface level of the second object can be registered and the position of the first object can be adjusted accordingly. The sensor is fast, independent on the substrate and can maintain the distance between the objects at high precision. Alternative or in addition to atomic force also other types of force may be measured, e.g. any type of force associated with scanning probe microscopy (SPM).

By using a feedback loop the distance can be accurately maintained when the height of the second object varies. For example, the distance can be controlled on the basis of a feedback signal from the sensor device. By connecting the sensor device comprising the probe tip at a variable distance from the object stage via a sensor stage, the probe level distance (e.g. measured transverse to the surface of the second object) can be varied. For example, a sensor stage comprising an actuator can be configured to variably set the probe level distance between a level of the probe tip and a level of the surface of the first object. Typically, the sensor stage is configured to translate the sensor device in the same direction as the object stage actuator. For example, the sensor stage is configured to translate the sensor device with respect to the first object. Accordingly, the probe level distance can be set to provide any desired distance between the first object and second object. The sensor stage can be a high precision stage, e.g. micrometer or even nanometer resolution. The sensor stage may e.g. comprise a combination of a micrometer resolution motorized stage and a nanometer resolution piezo stage. Accordingly, the probe level distance between the first object and the probe tip can be set close or equal to the desired distance between the first object and second object, e.g. within a margin of less than one micrometre, less than hundred nanometres, or less than ten nanometres, e.g. between one and ten nanometer. This may depend e.g. on a proximity at which the probe tip is intended to operate relative to the surface of the second object. Preferably, the controller is configured to calibrate the probe level distance between the probe tip and the first object.

By providing multiple sensor devices, each can measure a force between a respective probe tip and different parts of the surface of the second object. One or more object stage actuators can be configured to control respective distances between the first object and the different parts of the surface of the second object. Accordingly, the one or more object stage actuators may control a distance and/or tilt of the first object with respect to the surface of the second object. For example, an overall slow alignment and approach stage can be provided to move the system towards a substrate. For example the object stage actuators can be disposed between the approach stage and the object stage. The object stage actuators can provide relative fast adjustment of the distance and or tilt of the first object. The object stage can be configured to hold the first object at any position with respect to the probe tip. By holding the first object adjacent the probe tip over the surface of the second object, the distance between the objects can be very small. For example, the distance between the first object and the second object is less than hundred nanometres, less than fifty nanometres, e.g. between five and twenty nanometres. By keeping a small lateral distance between the probe tip and the edge of the adjacent first object (measured e.g. across the surface of the second object), the height of the second object measured by the probe tip is typically representative of the height at the first object. Accordingly, it is preferable that a lateral distance between the probe tip and an edge of the first object along a surface of the second object is less than five centimetres, two centimetres, one centimetre, or even less.

For example the probe tip can be an AFM tip. However, it will be appreciated that for the present purposes no sharp tip is needed, since lateral resolution is not always critical. Accordingly, tip radius can be relatively large, e.g. larger than ten nanometre, larger than hundred nanometre, larger than one micrometre. Of course also smaller tips can be used. The position of the probe tip can be measured by any means, e.g. normally employed in AFM technology. Typically, the probe tip is disposed on a cantilever. For example the sensor device comprises a high frequency actuator, e.g. piezo, configured to vibrate the probe tip in a dynamic mode, e.g. tapping mode. Also other modes can be used. A non contact mode may be preferred to prevent damage to the surface of the second object, e.g. substrate. By reflecting a light beam off the cantilever, the direction of the reflected light beam may be used to determine a proximity between the probe tip and the surface of the second object. For example, by using an optical fibre, light can be directed between a cantilever of the sensor device and an interrogator. For example an interrogator, e.g. based on interferometric principles can be used. The interrogator may provide a feedback signal to the controller indicative of a proximity between the probe tip and the surface of the second object.

Preferably at least three probe tips are used to measure not only distance but also the tilt of the surface in two directions. Also more, e.g. four probe tips can be used, e.g. for noise reduction. Each probe tip can be disposed on a respective cantilever and configured to measure a respective atomic force at different parts of the surface of the second object. By providing the probe tips in a triangular configuration, the probe tips can be arranged around a circumference of the first object as seen transverse to the surface of the second object. The tilt of the first object with respect to the surface of the second object can be based on the measurements of the three probe tips. The system may e.g. use three non-coupled controllers or an integrated controller. Accordingly three or more AFMs can be synchronized to cooperate in maintaining a desired alignment between the objects.

It will be appreciated that the present systems and methods can be employed e.g. in nanomanufacturing, e.g. in a lithographic apparatus comprising the alignment system. For example, the first object is a lens and the second object a mask. Accordingly, the object stage can be configured to hold the lens at a specific controlled distance from the mask. Typically, the lithographic apparatus comprises a mask stage and the lens is part of an imaging system configured to project an image onto the wafer. An (actinic) light source can be used project a mask image via the lens onto the substrate. Advantageously, the system can be configured to calibrate the probe level distance between the probe tip and the lens based on an image projected through the lens onto the second object, e.g. by a contrast measurement of the projected image. The present systems and methods can also be used in nano-metrology, nano-imaging, and/or inspection, to keep a nano-lens in focus or at a certain distance to the surface, such as solid immersion lens, hyper lens, metasurface, nanoantenna, super oscillatory lens and any other type of nearfield lens.

The substrate can be held by a wafer stage, wherein the wafer stage is configured to move the wafer along a surface direction i.e. transverse to the distance between the lens and the wafer. The system provides the particular advantage of keeping the first object at the controlled distance from the second object while moving the first object over the surface of the second object. More particularly the lithographic apparatus can be configured to keep the lens at a controlled distance from the wafer while moving the lens over the surface of the wafer. For example, the distance between the lens and wafer can be very small, e.g. in the range of one to hundred nanometer.

Another or further aspect of the present disclosure provides a method of aligning a first object at a controlled distanced with respect to a second object. The method comprises providing an object stage to hold a surface of the first object at a distance over a surface of the second object; providing an object stage actuator to actuate the object stage to vary the distance between the surfaces of the first and second objects; providing an sensor device comprising a probe tip connected at a predetermined probe level distance relative to the surface of the first object; using the probe tip is to perform an atomic force measurement of a force exerted via the probe tip on a surface of the second object; and controlling the object stage actuator as a function of the probe level distance and the measured force to keep the first object at the controlled distanced with respect to a second object. The method may include determining the probe level distance between the first object held by the object stage and the probe tip. The method may include moving the second object laterally with respect to the first object while keeping the controlled distance constant. Also other features as described herein with reference to the system can be analogously applied in the method, and vice versa, to provide similar advantages.

BRIEF DESCRIPTION OF DRAWINGS

These and other features, aspects, and advantages of the apparatus, systems and methods of the present disclosure will become better understood from the following description, appended claims, and accompanying drawing wherein:

DESCRIPTION OF EMBODIMENTS

Figure 1A:
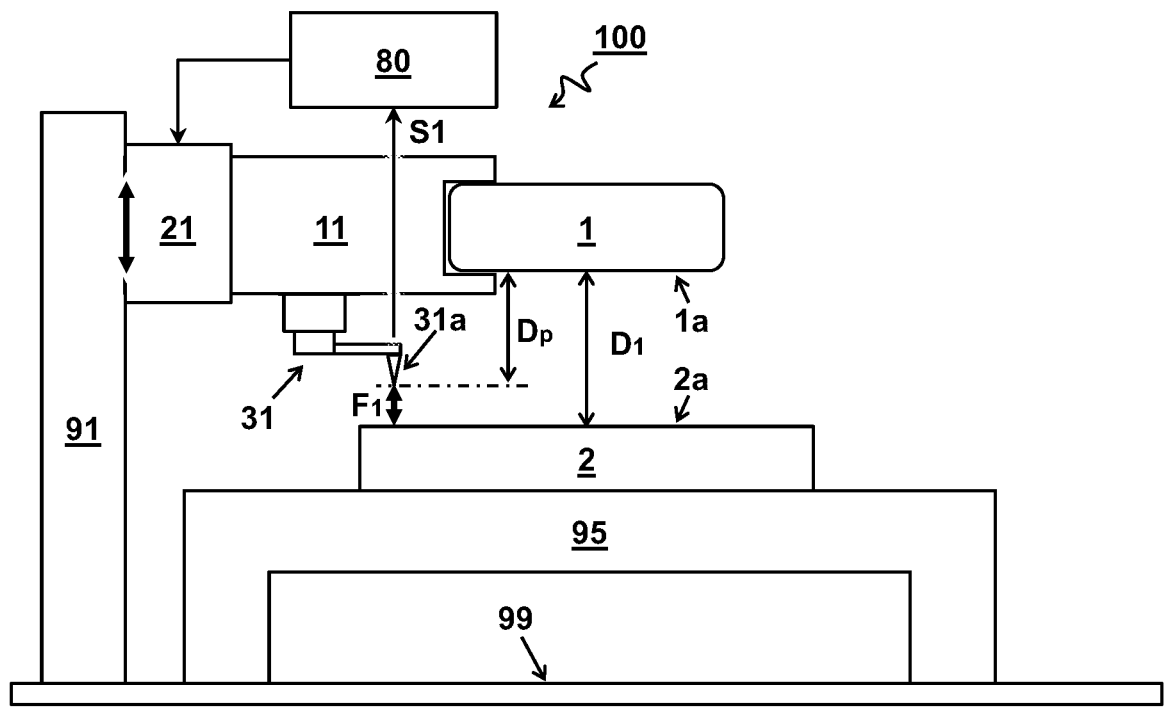
FIG. 1A schematically illustrates a first embodiment of an alignments system.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the absolute and relative sizes of systems, components, layers, and regions may be exaggerated for clarity. Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. In some instances, detailed descriptions of well-known devices and methods may be omitted so as not to obscure the description of the present systems and methods. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features.

FIG. 1A schematically illustrates a first embodiment of an alignment system 100 for keeping a first object 1 at a controlled distanced D1 with respect to a second object 2.

In the embodiment, the system 100 comprises an object stage 11 configured to hold a surface 1a of the first object 1 at a distance D1 over a surface 2a of the second object 2. An object stage actuator 21 is configured to actuate the object stage 11 to vary the distance D1 between the surfaces 1a,2a of the first and second objects 1,2. A sensor device 31 comprising a probe tip 31a is connected at a predetermined probe level distance Dp relative to the surface 1a of the first object 1, in use, held by the object stage 11. The probe tip 31a is configured to perform an atomic force measurement AFM of a force F1 exerted via the probe tip 31a on a surface 2a of the second object 2.

In one embodiment, a controller 80 configured to control the object stage actuator 21 as a function of the measured force F1 to keep the first object 1 at the controlled distanced D1 with respect to a second object 2. In another or further embodiment, the controller 80 is configured to control the object stage actuator 21 as a function of the probe level distance Dp and the measured force F1. For example, the controller 80 is configured to receive a feedback signal S1 from the sensor device 31 and to control the object stage actuator 21 to keep the first object 1 at the controlled distance D1 from the second object 2 based on the feedback signal S1.

According to some aspects, the figure illustrates a method of aligning a first object 1 at a controlled distanced D1 with respect to a second object 2. In one embodiment, the method comprises providing an object stage 11 to hold a surface 1a of the first object 1 at a distance D1 over a surface 2a of the second object 2. In another or further embodiment, the method comprises providing an object stage actuator 21 to actuate the object stage 11 to vary the distance D1 between the surfaces 1a,2a of the first and second objects 1,2. In another or further embodiment, the method comprises providing an sensor device 31 comprising a probe tip 31a connected at a predetermined probe level distance Dp relative to the surface 1a of the first object 1. In another or further embodiment, the method comprises using the probe tip 31a is to perform an atomic force measurement AFM of a force F1 exerted via the probe tip 31a on a surface 2a of the second object 2. In another or further embodiment, the method comprises controlling the object stage actuator 21 as a function of the probe level distance Dp and the measured force F1 to keep the first object 1 at the controlled distanced D1 with respect to a second object 2. In another or further embodiment, the method comprises determining the probe level distance Dp between the first object 1 held by the object stage 11 and the probe tip 31a. In another or further embodiment, the method comprises moving the second object 2 laterally with respect to the first object 1 while keeping the controlled distance D1 constant.

While the present embodiment shows the first object 1 being moved, alternatively or in addition, the second object 1 can be moved. For example, in one embodiment (not shown), the system 100 comprises an object stage configured to hold a surface 2a of the second object 2 at a distance D1 below a surface 1a of the first object 1. Similar as the shown embodiment, an object stage actuator 21 is configured to actuate the object stage to vary the distance D1 between the surfaces 1a,2a of the first and second objects 1,2 (however by moving the second object). Similar as the shown embodiment, a sensor device 31 comprising a probe tip 31a is connected at a predetermined probe level distance Dp relative to the surface 1a of the first object 1. Optionally, the first object 1 can be held stationary, e.g. by a rigid construction or platform that does not move in the direction towards the second object 2. Similar as the shown embodiment, the probe tip 31*a* may be configured to perform an atomic force measurement AFM of a force F1 exerted via the probe tip 31*a* on a surface 2*a* of the second object 2. Alternatively, if the probe tip is configured to measure a force exerted on a surface 1*a* of the first object 1 a system may be obtained that is inverted compared to the embodiment shown in the figure.

Figure 1B:
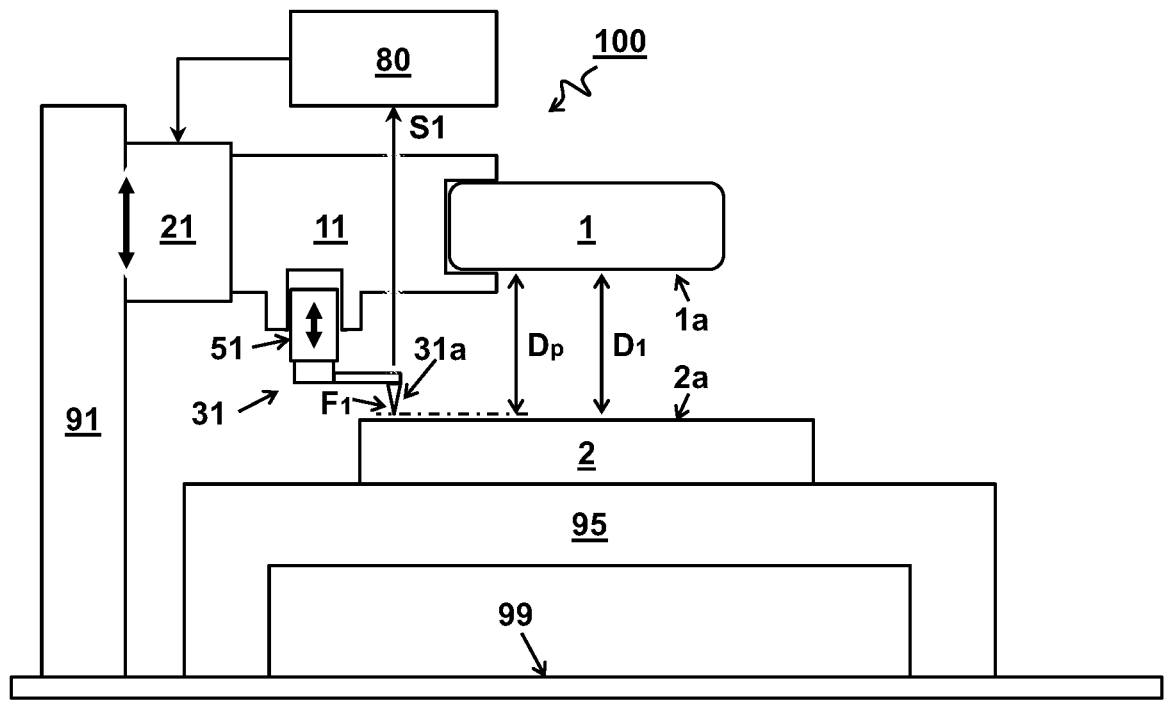
FIG. 1B schematically illustrates a second embodiment of an alignments system with adjustable probe level distance.

FIG. 1B schematically illustrates a second embodiment of an alignments system 100 with adjustable probe level distance Dp.

In the embodiment, the sensor device 31 comprising the probe tip 31*a* is connected to the object stage 11 via a sensor stage 51, wherein the sensor stage 51 comprises an actuator configured to variably set the probe level distance Dp between a level of the probe tip 31*a* and a level of the surface 1*a* of the first object 1. For example, the probe level distance Dp is measured transverse to the surface 2*a* of the second object 2. In another or further embodiment, the probe level distance Dp is set as a function of a desired distance D1 between the first object 1 and second object 2.

In one embodiment, the probe level distance Dp between the first object 1 and the probe tip 31*a* is set close or equal to the desired distance D1 between the first object 1 and second object 2, e.g. within a margin of less than one micrometre, less than hundred nanometres, or less than ten nanometres. This may depend e.g. on a proximity at which the probe tip 31*a* is intended to operate relative to the surface 2*a* of the second object 2. In another or further embodiment, the controller is configured to calibrate the probe level distance Dp between the probe tip 31*a* and the first object 1.

In one embodiment, the sensor stage 51 is configured to translate the sensor device 31 in the same direction as the object stage actuator 21. For example, the sensor stage 51 is configured to translate the sensor device 31 with respect to the first object 1. In one embodiment, as shown, the sensor stage 51 is (only) connected to a fixed surroundings, e.g. fixed structural element 91, via the object stage actuator 21. In other words, the sensor stage 51 preferably is carried by and/or moves relative to the object stage 11. This may allow more accurately setting a variable distance between the first object 1 and the second object 2 compared to a configuration with two independent stages, e.g. because then an unknown variance of the object stage may affect a determination of the relative distance between the sensor device 31 and the first object 1. The fixed structural element 91 may e.g. be directly or indirectly connected to a building structure, e.g. floor 99 and/or substrate table 95. Alternatively, or in addition, the fixed structural element may connected to a metro-frame or main frame of the system.

Figure 2A:
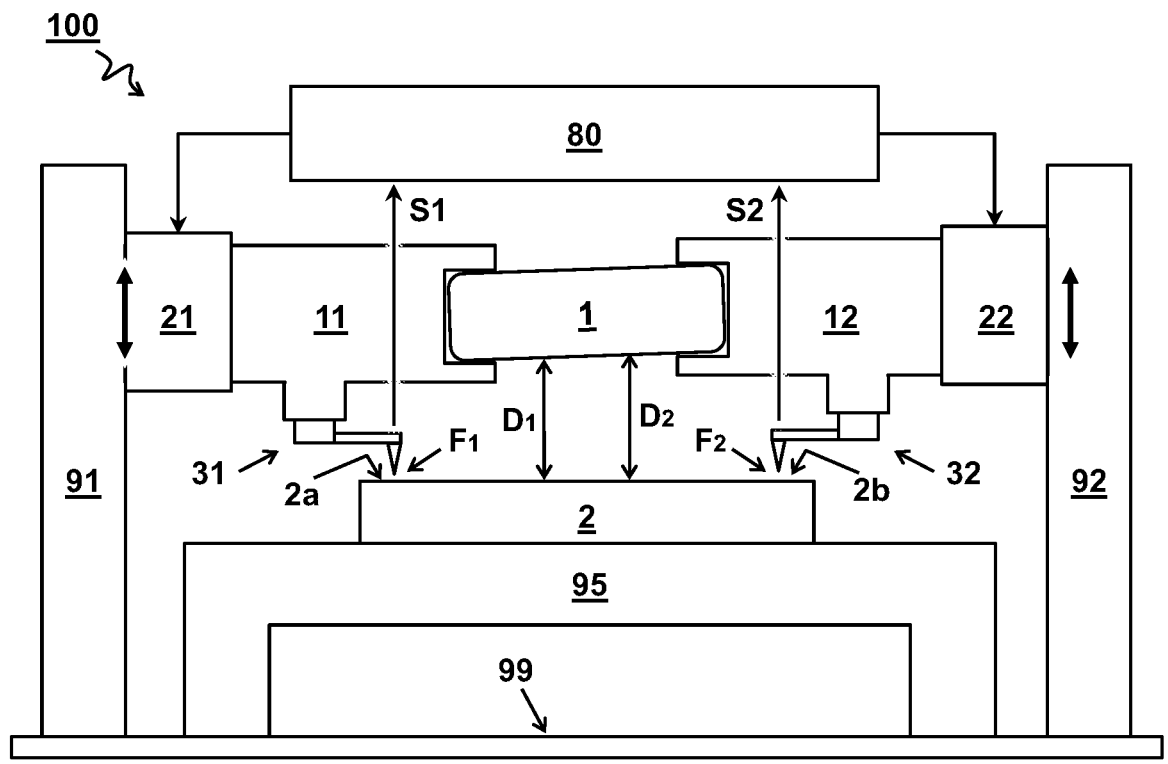
FIG. 2A schematically illustrates a third embodiment of an alignments system with multiple sensor devices.

FIG. 2A schematically illustrates a third embodiment of an alignments system 100 with multiple sensor devices.

In one embodiment, the system 100 comprises at least two sensor devices 31,32 each configured to measure a force F1,F2 between a respective probe tip 31*a*,32*a* and different parts 2*a*,2*b* of the surface 2*a* of the second object 2. In another or further embodiment, the system comprises one or more object stage actuators 21,22 configured to control respective distances D1,D2 between the first object 1 and the different parts 2*a*,2*b* of the surface 2*a* of the second object 2. In another or further embodiment, the one or more object stage actuators 21,22 are configured to control a distance and tilt of the first object 1 with respect to the surface 2*a*,2*b* of the second object 2.

Figure 2B:
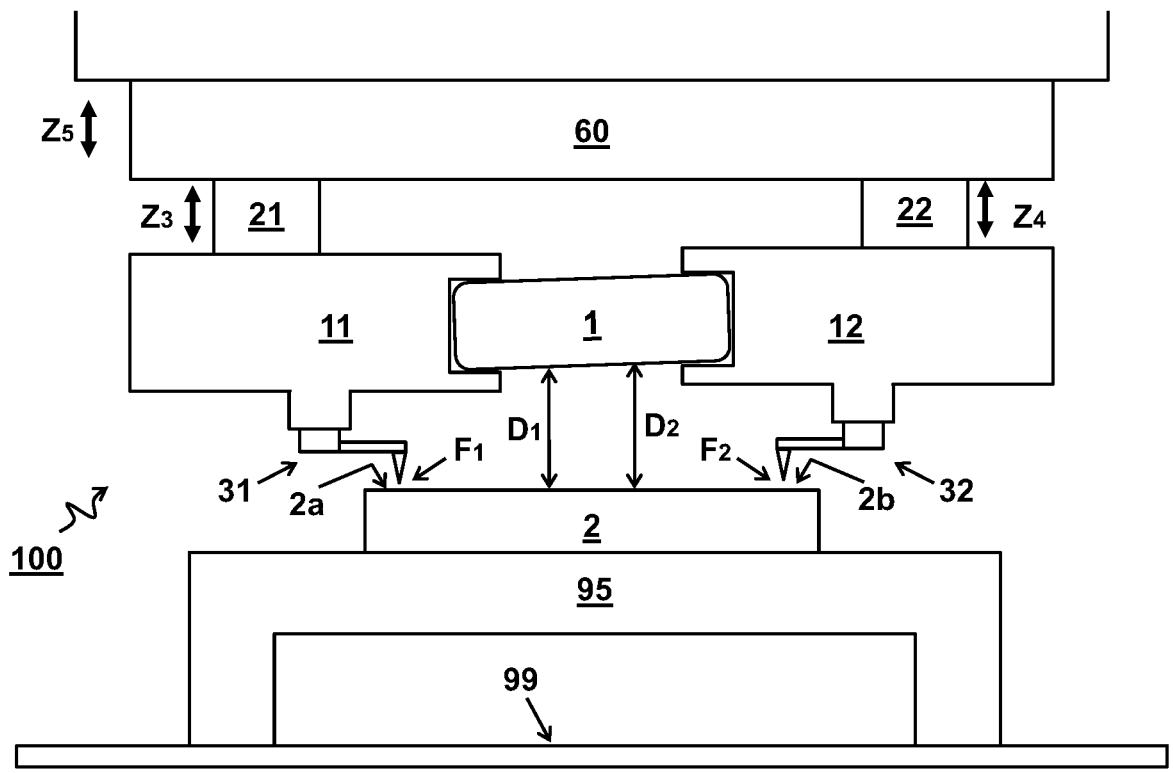
FIG. 2B schematically illustrates a fourth embodiment of an alignments system including an approach stage.

FIG. 2B schematically illustrates a fourth embodiment of an alignments system 100 comprising an approach stage 60 configured to position the first object 1 with respect to the second object 2. In one embodiment, a plurality of object stage actuators 21,22 are disposed between the object stage 11 and the approach stage 60.

Figure 3:
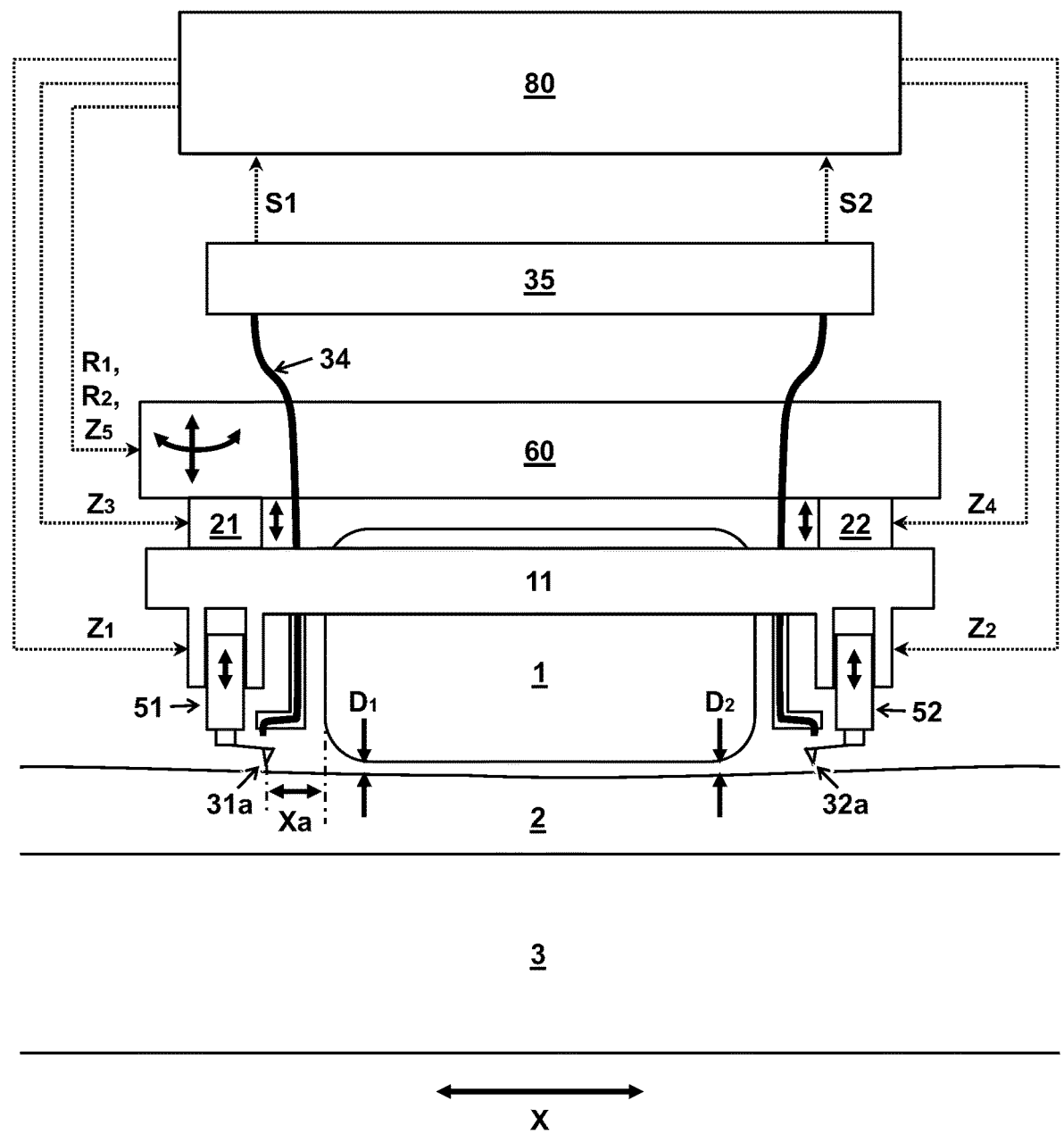
FIG. 3 schematically illustrates a fifth embodiment of an alignments system combining features of some of the other embodiments.

FIG. 3 schematically illustrates a fifth embodiment of an alignments system combining features of some of the other embodiments. In the embodiment, the alignment system 100 comprises multiple sensor devices with probe tips 31*a*,32*a*. In the embodiment, the alignment system 100 comprises multiple object stage actuators 21,22 disposed between the object stage 11 and an approach stage 60.

In one embodiment, the object stage 11 is configured to hold the first object 1 adjacent the probe tip 31*a* over the surface 2*a* of the second object 2. In another or further embodiment, the distance D1 between the first object 1 and the second object 2 is less than hundred nanometres, less than fifty nanometres, e.g. between five and twenty nanometres. In one embodiment, a lateral distance Xa between the probe tip 31*a* and an edge of the first object 1 along a surface 2*a* of the second object 2 is less than five centimetres, two centimetres, one centimetre.

For example, the approach stage 60 comprises an overall slow alignment and approach stage having a resolution e.g. of 100 nm (distance Z5) and/or 10 μrad (tilt R1,R2). For example, the object stage actuators 21,22 provide the object stage 11 with relatively fast tracking, e.g., having a range of 3 μm and high resolution of less than 1 nanometre. In one embodiment the sensor stage 51 comprises a coarse alignment which can be for example manually operated. For example the coarse alignment has a range of 500 μm and resolution of one micrometer. Alternatively, or additionally, for example the sensor stage 51 comprises medium alignment with a lower range, e.g. 5 μm and a higher resolution, e.g. 1 nm. For example, the probe tip 31*a* on a 100 kHz cantilever is actuated by a piezo e.g. with 100 kHz dither. For example three or more probe tips can be used as will be described with reference to FIG. 4.

In one embodiment, the system comprises an optical fibre 34 configured to direct light between a cantilever of the sensor device 31 and an interrogator 35. In another or further embodiment, the interrogator 35 is an interferometric interrogator. In another or further embodiment, the interrogator 35 is configured to send a feedback signal S1 to the controller 80 indicative of a proximity between the probe tip and the surface 2*a* of the second object 2. The controller 80 can e.g. comprise a feedback controller.

Figure 4A:
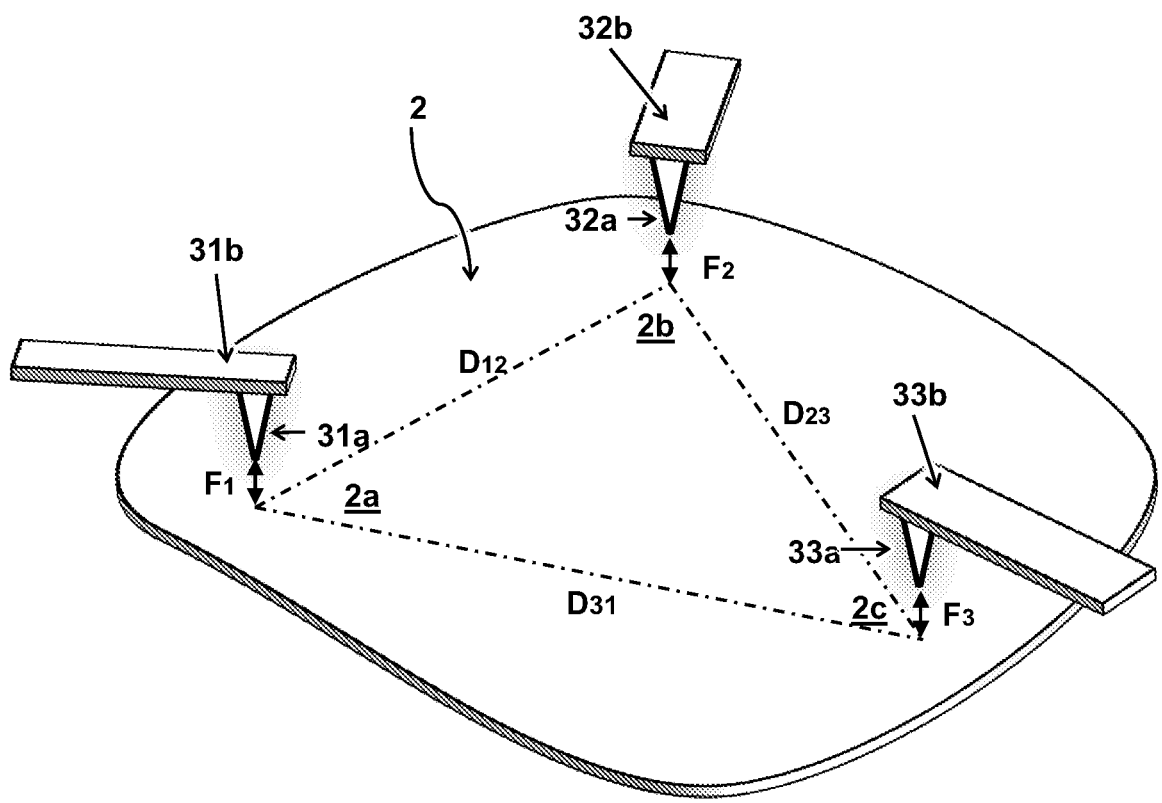
FIGS. 4A and 4B schematically illustrate the positioning of three sensor probes.
Figure 4B:
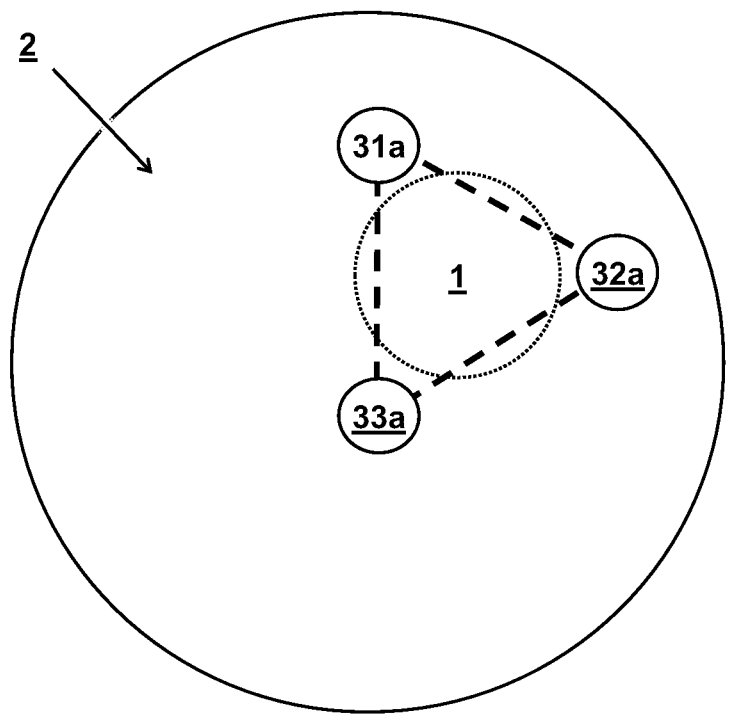

FIGS. 4A and 4B schematically illustrate the positioning of three sensor probes. In one embodiment, a distance D12 (and/or D23,D31) between a first probe tip 31*a* and a second probe tip 32*a* is at least two millimetre, at least five millimetre, e.g. between one and five centimetre.

In one embodiment, the alignments systems as described herein comprise at least three probe tips 31*a*, 32*a*, 33*a*. In another or further embodiment, each probe tip 31*a*, 32*a*, 33*a* is disposed on a respective cantilever 31*b*,32*b*,33*b* and configured to measure a respective atomic force F1,F2,F3 at different parts 2*a*,2*b*,2*c* of the surface of the second object 2. In another or further embodiment, the probe tips 31*a*, 32*a*, 33*a* are arranged in a triangular configuration, e.g. to measure tilt. In another or further embodiment, the probe tips 31*a*, 32*a*, 33*a* are arranged around a circumference of the first object 1 as seen transverse to the surface 2*a* of the second object 2 in FIG. 4B.

In another or further embodiment, the controller (not shown here) is configured to control a tilt of the first object with respect to the surface 2a of the second object 2 based on the measurements of the three probe tips. For example three non-coupled controllers can be used. For example three or more AFMs are synchronized to cooperate to keep a specific alignment.

Figure 5A:
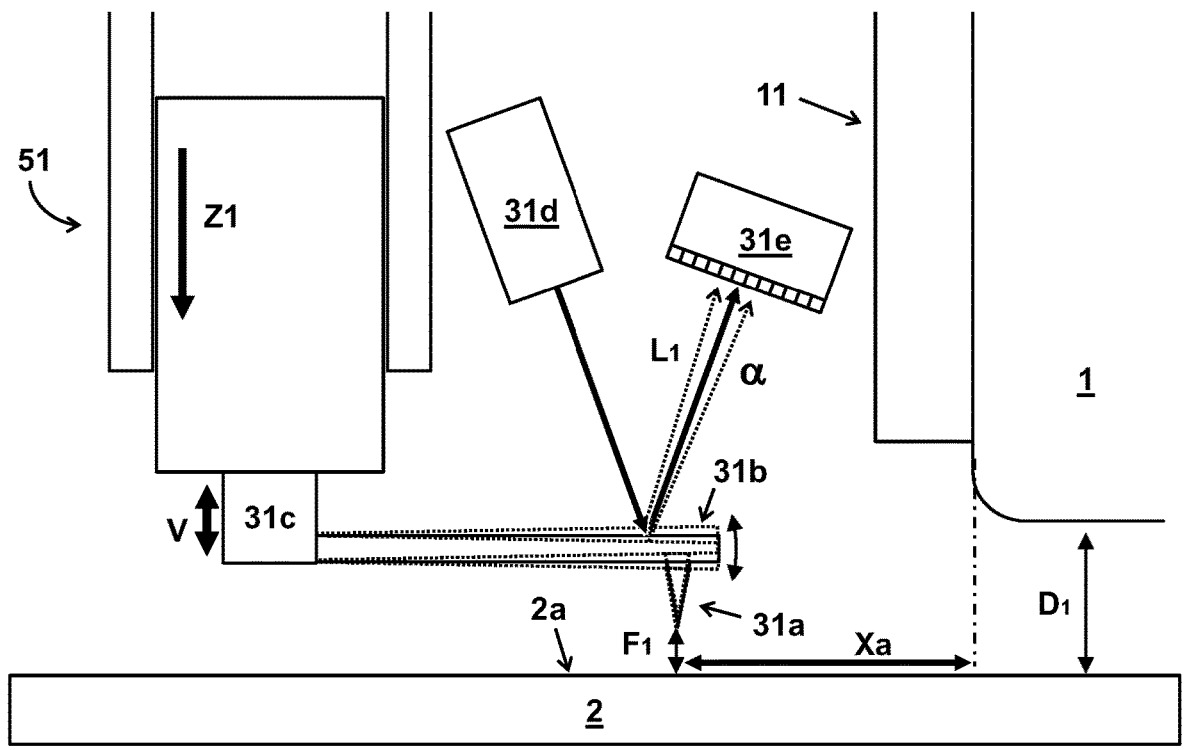
FIG. 5A schematically illustrates example details of a probe tip adjacent the first object over a surface of the second object.

FIG. 5A schematically illustrates example details of a probe tip 31a adjacent the first object 1 over a surface 2a of the second object 2.

In one embodiment, the probe tip 31a comprises an AFM tip. In another or further embodiment, the probe tip 31a is disposed on a cantilever 31b. In another or further embodiment, the sensor device 31 comprises a high frequency actuator 31c, e.g. piezo, configured vibrate the probe tip in a dynamic mode, e.g. tapping mode.

In one embodiment, the sensor device 31 comprises a light source 31d configured to reflect a light beam L1 off the cantilever 31b. In another or further embodiment, the sensor device 31 comprises a sensor, e.g. position sensitive sensor 31e configured to measure a direction of the reflected light beam L1 to determine a proximity between the probe tip 31a and the surface 2a of the second object 2, e.g. based on the atomic force F1 influencing the frequency, phase, angle or other observable of the cantilever.

Figure 5B:
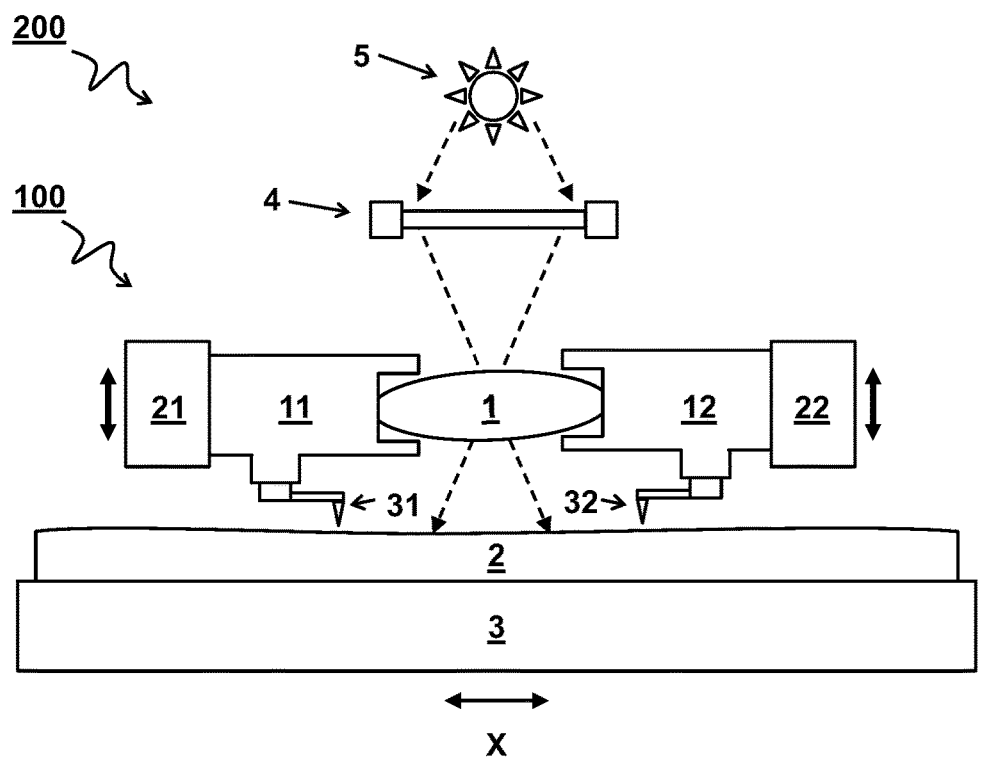
FIG. 5B schematically illustrates use of the alignment system in a lithographic apparatus.

FIG. 5B schematically illustrates use of the alignment system 100 in a lithographic apparatus 200.

In one embodiment, a lithographic apparatus 200 comprises the alignment system 100 as described herein. In one embodiment, the first object 1 is a lens and the object stage 11 is configured to hold the lens In another or further embodiment, the second object 2 is a wafer.

In one embodiment, the lithographic apparatus 200 comprises an actinic light source 5. In another or further embodiment, the lithographic apparatus 200 comprises a mask stage 4. In another or further embodiment, the lens is part of an imaging system configured to project an image (e.g. of the mask) onto the wafer.

In one embodiment, the lithographic apparatus 200 comprises a wafer stage 3. In another or further embodiment, wherein the system is configured to calibrate the probe level distance between the probe tip 31a and the lens 1 based on an image projected through the lens onto the second object 2, e.g. by a contrast measurement of the projected image. In another or further embodiment, the wafer stage 3 is configured to move the wafer 2 along a surface direction X i.e. transverse to the distance D1 between the lens and the wafer. In another or further embodiment, the system is configured to keep the first object 1 at the controlled distance D1 from the second object 2 while moving the first object 1 over the surface 2a of the second object 2. For example, the system is configured to keep the lens 1 at a controlled distance from the wafer 2 while moving the lens over the surface of the wafer. For example a distance between the lens and wafer is kept at a value in a range of 1-100 nm. For example the lithographic apparatus 200 may operate in a scanning mode.

It is noted that a conventional AFM system typically does not have a reference point, i.e. wherein an absolute height with respect to the reference is implemented, contrary to the present system wherein level sensing is used. For example, the AFM stage can be combined with the stage of the object to be positioned.

Figure 6A:
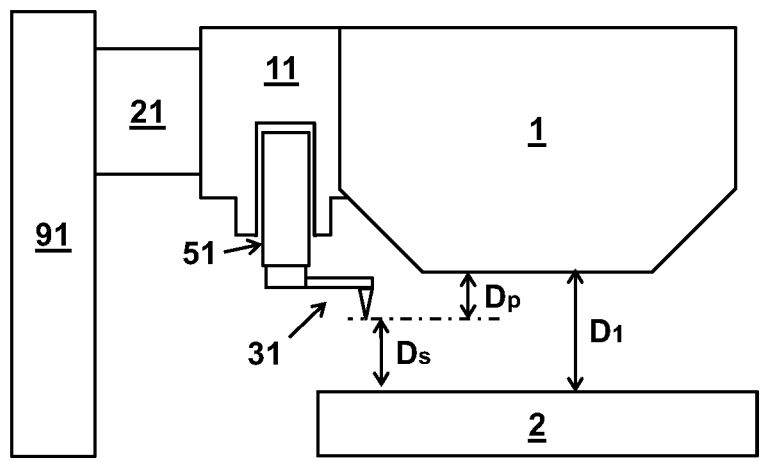
FIGS. 6A-6C schematically show an embodiment for setting a distance between objects.
Figure 6B:
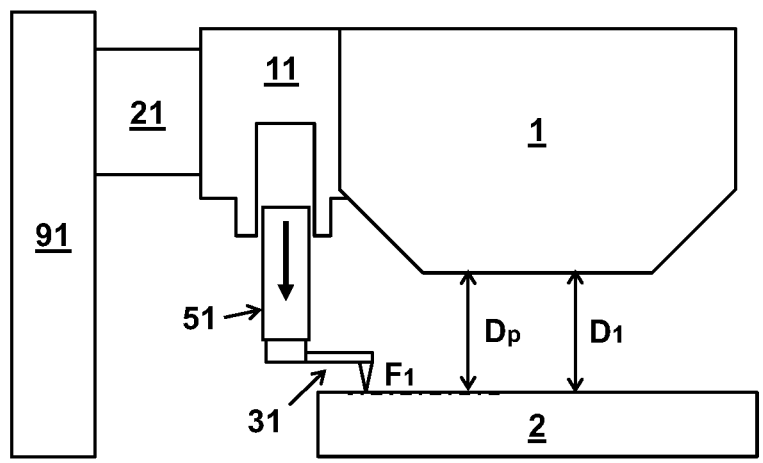
Figure 6C:
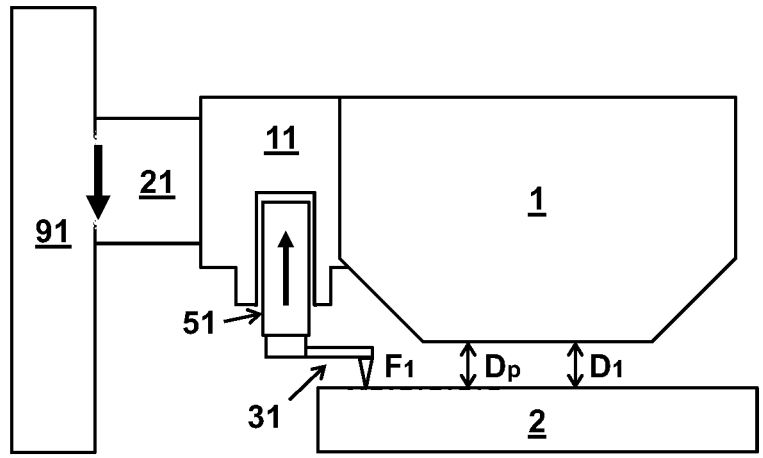

FIGS. 6A-6C schematically show an embodiment for setting a distance between a first object 1 and a second object 2.

In one embodiment a distance D1 between the first object 1 and the second object 2 is lowered by a sequence of steps. For example in one step, as shown by comparison of FIGS. 6A and 6B, a distance Ds between the sensor device 31 and the second object 2 is lowered until the sensor device 31 measures a predetermined force F1 exerted via the probe tip on the surface of the second object 2. For example in another or further step, as shown by comparison of FIGS. 6B and 6C, the distance between the sensor device 31 and the second object 2 is kept constant (e.g. based a feedback of the measured force F1) while a distance between a level of the first object 1 and a level of the sensor device 31 is lowered until the predetermined probe level distance Dp is reached. Such sequence of steps may provide an advantage in that the sensor stage 51 can be relatively light and therefore more easily move to quickly approach the second object to determine its position. The heavier object stage 11 (holding the first object 1) may then follow at a controlled descent with relatively high speed while decelerating before the determined position without the risk of overshoot and running into the second object.

In some embodiments, the distance Ds between the sensor device 31 and the second object 2 is decreased by actuating the sensor stage 51. In other or further embodiments, the distance between the sensor device 31 and the second object 2 is kept constant while the distance between the first object 1 and the sensor device 31 is lowered by simultaneously actuating the sensor stage 51 and the object stage 11 in opposite directions. For example, a first feedback loop includes actuating the sensor stage 51 based on the measured force F1 exerted via the probe tip on the surface 2a of the second object 2. For example, a second feedback loop includes actuating the object stage 11 based on a direct distance measurement between the sensor device 31 and the first object 1 and/or object stage 11.

Figure 7A:
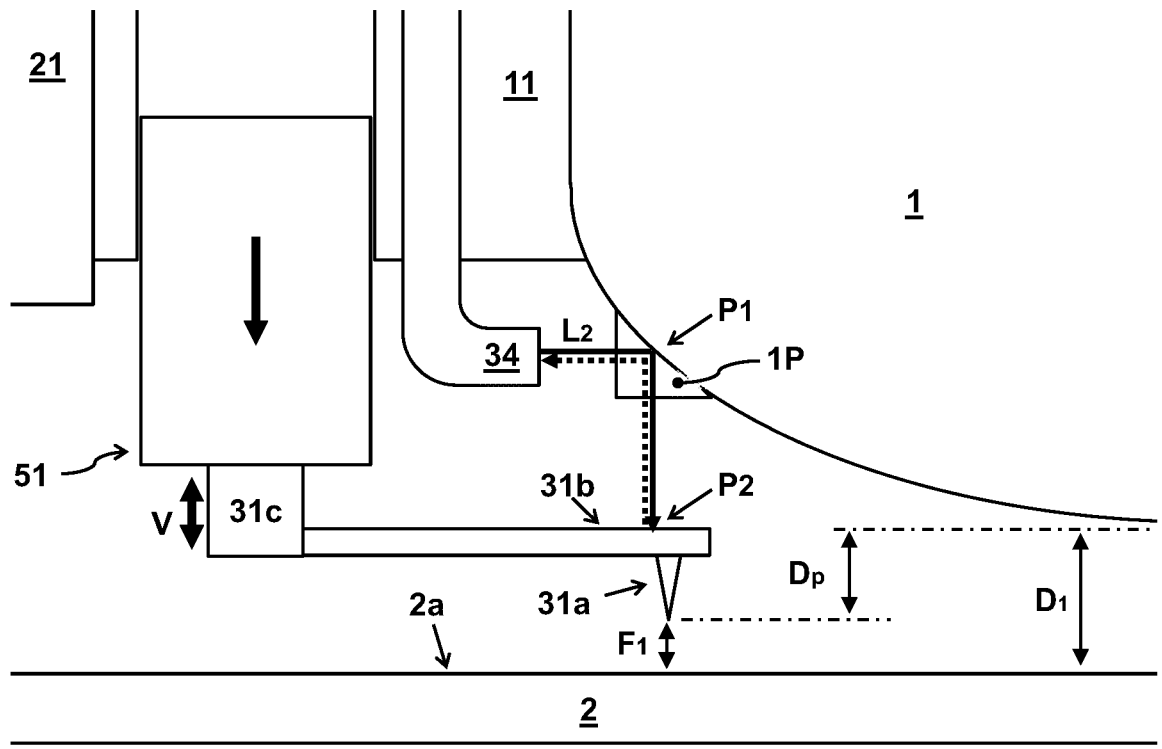
FIGS. 7A and 7B schematically show an embodiment for directly measuring a distance.
Figure 7B:
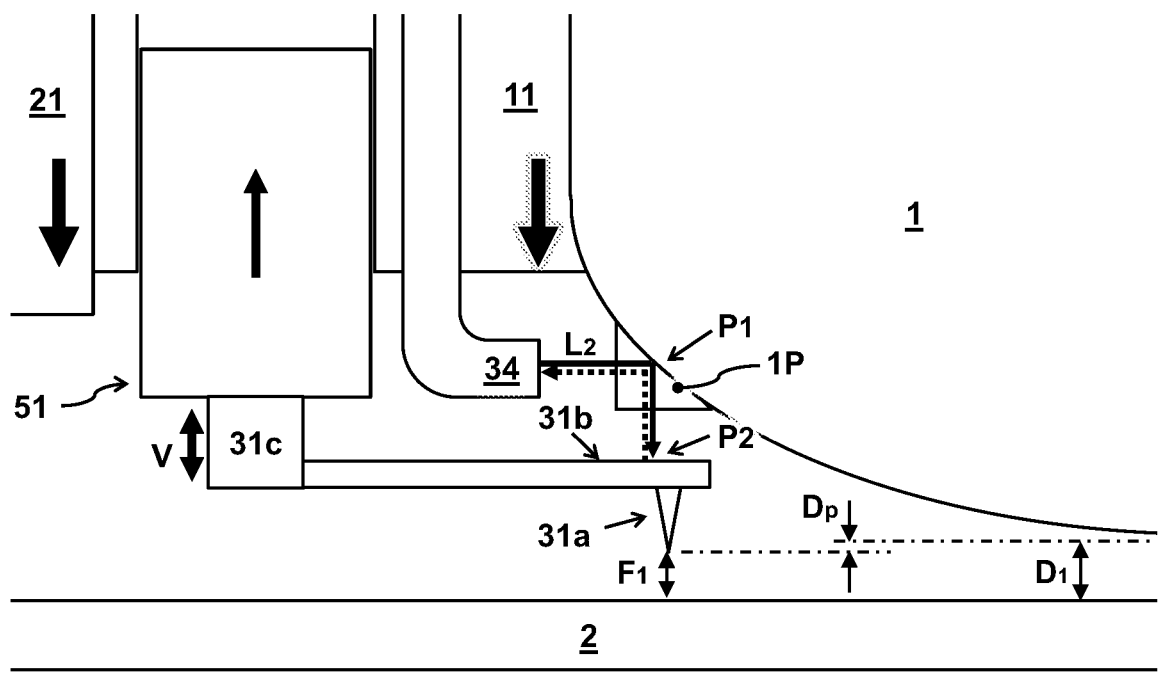

FIGS. 7A and 7B schematically show an embodiment for directly measuring a distance between a level of the first object 1 and a level of the sensor device 31. FIG. 7A shows the object stage 11 in a retracted position while the sensor stage 51 is set to an approached position to sense the second object 2, e.g. substrate, via an AFM measurement of the force F1 on the probe tip 31a. FIG. 7B shows the object stage 11 in an approached position which can be achieved by simultaneously using the object stage actuator 21 to lower the object stage 11 while actuating the sensor stage 51 to retract with respect to the object stage 11 to keep a fixed distance with respect to the surface of the second object 2.

In one embodiment, the system comprises a distance sensing arrangement configured to directly measure a distance between a first position P1 that is fixed relative to the first object 1 and/or the object stage 11 (both of which are fixed relative to each other), and a second position P2 that is fixed relative to the sensor device 31 and/or sensor stage 51. Preferably, the first position P1 is a position that moves in a fixed relation with respect to the first object 1 and/or object stage 11. Preferably, the second position P2 is a position that moves in a fixed relation with respect to the sensor device 31.

In some embodiments, e.g. a controller (not shown) is configured to calculated a change of the probe level distance Dp based on a change of the measured distance between the first and second positions P1,P2. For example, the controller is configured to determine a position of the sensor device 31 with respect to the first object 1 based on an interferometric measurement. Advantageously, the probe level distance Dp may be monitored based on feedback of the distance measurement between the first and second positions P1,P2. The probe level distance can also be used in a closed feedback loop to achieve or maintain a predetermined distance.

In one embodiment, the system comprises a light guide configured to direct a light beam L2 from a light source along a light path to a light sensor, wherein the light path traverses the first and second positions P1,P2. Preferably, the first position P1 is disposed on a surface of the first object 1, e.g. lens surface. The second position P2 is preferably disposed on a surface of the sensor device 31, e.g. the cantilever 31b or any other position that moves with the sensor stage 51. In some embodiments, the light beam L2 is reflected at both the first position P1 and the second position P2. For example, the light beam L2 is reflected off a surface of the first object 1, e.g. lens surface. Optionally, there is provided a prism 1P or other light guiding means attached to a surface of the first object 1 to guide and/or reflect the light beam L2. For example, the light beam L2 is reflected off a surface of the sensor device 31, e.g. the light beam is reflected off the cantilever 31b.

In the embodiment shown, the light guide comprises an optical fibre 34. For example, the light guide is configured to send the light beam L2 to reflect onto the surfaces of the first object 1 and sensor device 31 and to receive a back reflection thereof. Preferably, the system is configured to perform an interferometric measurement of the light beam L2 to measure a change of the distance between the first and second positions P1,P2. For example an optical fiber 34 and interrogator 35 such as shown with reference to FIG. 3B can be used.

Alternatively, or in addition to the light guide, the system can also use an integrated sensor and actuator, e.g. electrostatic, piezoresistive, thermal, et cetera, for measuring one or more of the positions P1, P2 and/or a distance there between.

Figure 8A:
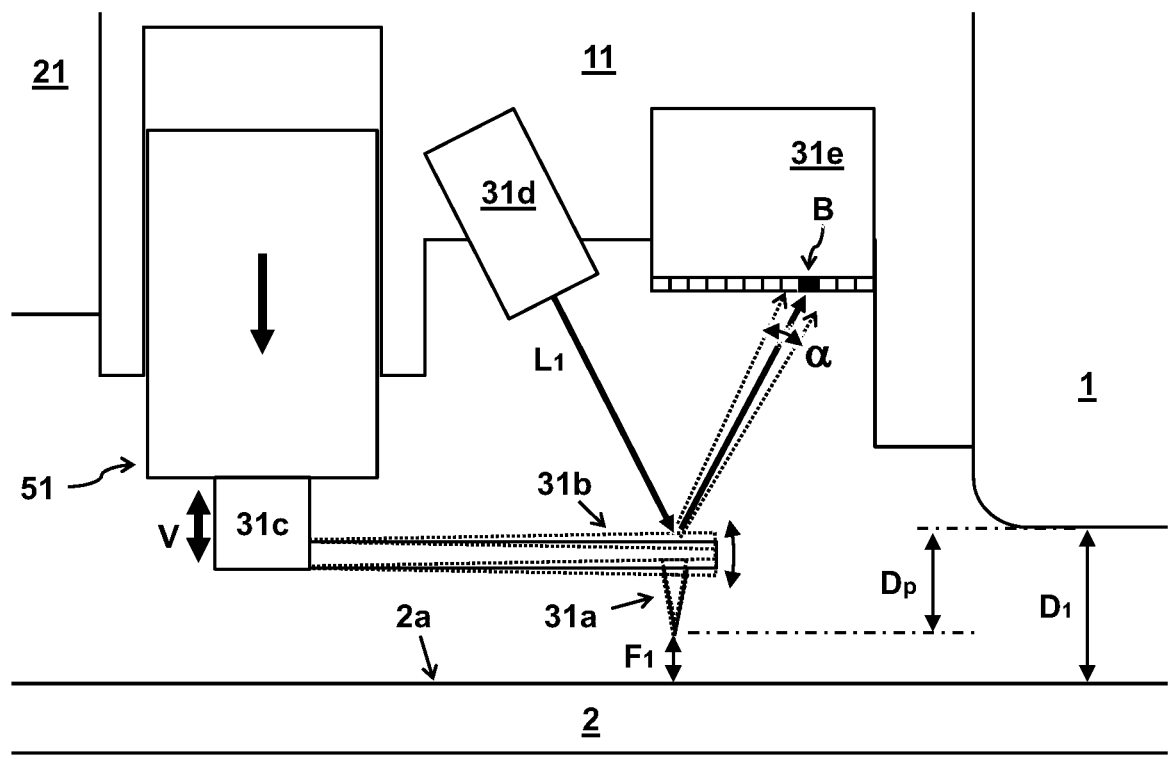
FIGS. 8A and 8B schematically show another embodiment for directly measuring a distance.
Figure 8B:
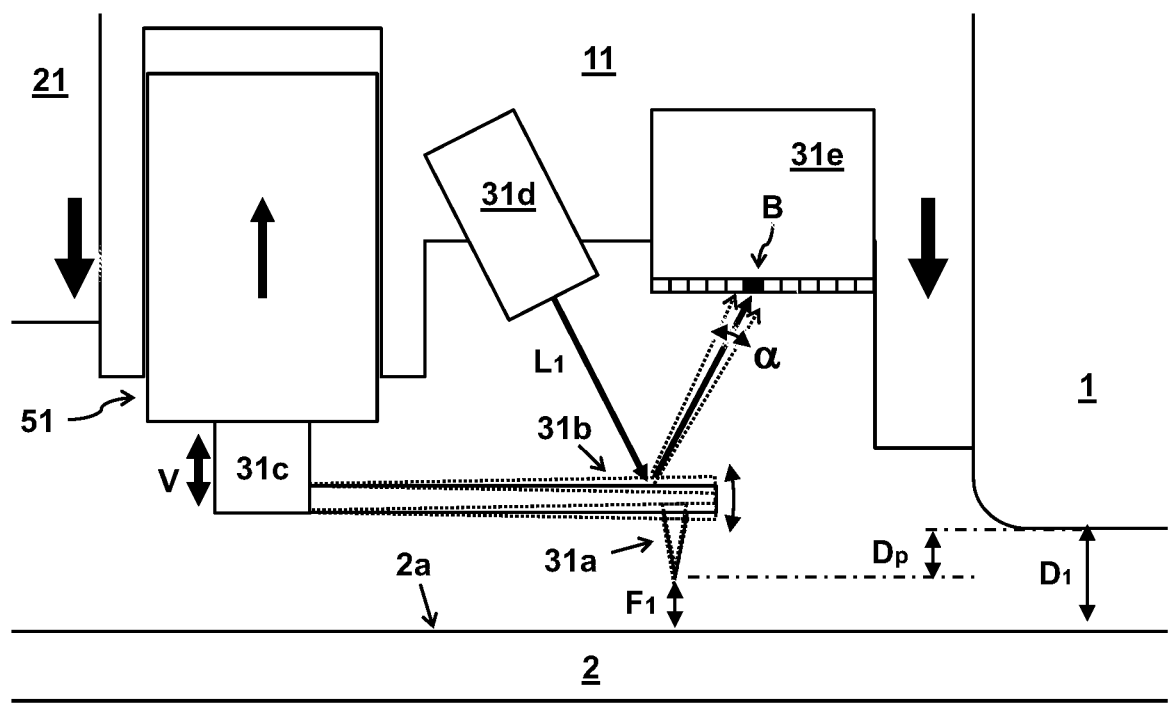

FIGS. 8A and 8B schematically show another embodiment for directly measuring a distance between a level of the first object 1 and a level of the sensor device 31.

In the embodiment, the distance sensing arrangement comprises a light source 31d and a light sensor 31e. Preferably, one or both of the light source 31d and/or light sensor 31e are fixed to the object stage 11. Furthermore, preferably the light source 31d is configured to reflect a light beam L1 via a surface of the sensor device 31, e.g. cantilever 31b. For example, the light sensor 31e is a position sensitive detector configured to measure a position where a reflection of the light beam impinges the light sensor 31e. It will be appreciated by comparing FIGS. 8A and 8B that an average B of the position may be used as a measure for the distance between the levels of the sensor device 31 and the first object 1. At the same time, an amplitude "a", period, and/or phase of the position can be used a measure for the force F1 between the sensor device 31 and the second object 2.

In one embodiment (not shown), a low pass filter is used on an output signal of the light sensor 31e for providing a signal that is indicative of the relative position of the sensor device 31 with respect to the object stage 11. Similarly, a high pass filter can be used to determine the variation of the cantilever angles which is indicative of the force F1 and/or proximity of the surface 2a.

Alternatively, or in addition to moving the first object 1 with the object stage 11, the second object 2 can be moved by an object stage, e.g. moveable substrate table (not shown). In one embodiment, first the cantilever is sent down to detect the surface (or the substrate is brought up to detect) and then slowly and in a controlled way the substrate or sample is brought up to a defined position, e.g. between P1 and P2 as illustrated in FIG. 7. Of course also other variations and combinations are possible.

For the purpose of clarity and a concise description, features are described herein as part of the same or separate embodiments, however, it will be appreciated that the scope may include embodiments having combinations of all or some of the features described. In the shown embodiments, an AFM sensor device with probe tip on a cantilever is used as a force sensor for determining distance. However also other probe tips e.g. having higher tip radius may be used with similar effect. In the shown embodiments, an optical beam deflection (OBD) setup and/or interferometric measurement using optical fibres is used as a readout technique to measure the deflection of the sensing cantilever However, also other readout techniques for measuring the sensing cantilever motion may be envisaged by those skilled in the art having the benefit of the present disclosure for achieving a similar function and result. The systems and methods as described herein can also be applied in a parallel setting, e.g. multiple systems can be simultaneously active. For example two or more systems can be simultaneously used to keep respective objects at respective distances. For example a first system may keep a first lens at a predetermined distance from a wafer while a second system keeps a second lens at another or the same predetermined distance from the same wafer, e.g. at a different position on the wafer. Using multiple systems in parallel may further increase productivity. The systems in a parallel setting may also cooperate to achieve even further advantage.

Components may optionally be combined or split up into one or more alternative components. The various elements of the embodiments as discussed and shown offer certain advantages, such as prevention of sample or tip damage, higher precision of the measurement, and enabling extraction of quantitative physical and mechanical properties. Of course, it is to be appreciated that any one of the above embodiments or processes may be combined with one or more other embodiments or processes to provide even further improvements in finding and matching designs and advantages. It is appreciated that this disclosure offers particular advantages e.g. in nanosystems for industrial applications, wherein accurate alignment between components is desired, e.g. semiconductor, metrology, and/or biomedical fields, and in general can be applied for any alignment system.

Finally, the above-discussion is intended to be merely illustrative of the present systems and/or methods and should not be construed as limiting the appended claims to any particular embodiment or group of embodiments. The specification and drawings are accordingly to be regarded in an illustrative manner and are not intended to limit the scope of the appended claims. In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. The mere fact that certain measures are recited in mutually different claims does not indicate that a combination of these measures cannot be used to advantage. In particular, all working combinations of the claims are considered inherently disclosed.

The invention claimed is:

1. An alignment system for positioning and/or keeping a first object at a controlled distanced (D1) with respect to a second object, the system comprising:
   an object stage configured to hold the first object or the second object, wherein a surface of the first object is at a distance (D1) over a surface of the second object;

an object stage actuator configured to actuate the object stage to vary the distance (D1) between the surfaces of the first and second objects;

a sensor device comprising a probe tip connected at a predetermined probe level distance (Dp) relative to the surface of the first object, wherein the probe tip is configured to perform an atomic force measurement (AFM) of a force (F1) exerted via the probe tip on a surface of the second object; and a controller configured to control the object stage actuator as a function of the probe level distance (Dp) and the measured force (F1) to position and/or keep the first object at the controlled distanced (D1) with respect to a second object, wherein the sensor device comprising the probe tip is carried by the object stage via a sensor stage, wherein the sensor stage comprises an actuator configured to variably set the probe level distance (Dp) between a level of the probe tip and a level of the surface of the first object.

2. The system according to claim 1, wherein the sensor stage is only connected to a fixed structural element via the object stage actuator.

3. The system according to claim 1, wherein the controller is configured to calibrate the probe level distance (Dp) between the probe tip and the first object.

4. The system according to claim 1, wherein the controller is configured to decrease a distance (D1) between the first object and the second object by a sequence of:

decreasing a distance (Ds) between the sensor device and the second object until the sensor device measures a predetermined force (F1) exerted via the probe tip on the surface of the second object; and keeping the distance between the sensor device and the second object constant based a feedback of the measured force (F1) while lowering a distance between a level of the first object and a level of the sensor device until the predetermined probe level distance (Dp) is reached.

5. The system according to claim 1, wherein the system comprises a distance sensing arrangement configured to directly measure a distance between a first position (P1) that is fixed relative to the first object and/or object stage, and a second position (P2) that is fixed relative to the sensor device and/or sensor stage, wherein the system comprises a light guide configured to direct a light beam (L2) from a light source along a light path to a light sensor, wherein the light path traverses the first and second positions (P1, P2), wherein the system is configured to perform an interferometric measurement of the light beam (L2) to measure a change of the distance between the first and second positions (P1, P2).

6. The system according to claim 1, comprising at least two sensor devices each configured to measure a force (F1, F2) between a respective probe tip and different parts of the surface of the second object.

7. The system according to claim 1, comprising an approach stage configured to position the first object with respect to the second object, wherein a plurality of object stage actuators are disposed between the object stage and the approach stage to control respective distances (D1, D2) between the first object and the different parts of the surface of the second object.

8. The system according to claim 1, comprising at least three probe tips arranged in a triangular configuration.

9. The system according to claim 8, wherein the controller is configured to control a tilt (R1, R2) of the first object with respect to the surface of the second object based on the measurements of the three probe tips.

10. The system according to claim 1, wherein the system is configured to keep the first object at the controlled distance (D1) from the second object while moving the first object over the surface of the second object.

11. A lithographic apparatus comprising an alignment system for positioning and/or keeping a lens at a controlled distanced with respect to a substrate, the system comprising an object stage configured to hold the lens, wherein a surface of the lens is at a distance over a surface of the substrate; an object stage actuator configured to actuate the object stage to vary the distance between the surfaces of the lens and substrate; a sensor device comprising a probe tip connected at a predetermined probe level distance relative to the surface of the lens, wherein the probe tip is configured to perform an atomic force measurement of a force exerted via the probe tip on a surface of the substrate; a controller configured to control the object stage actuator as a function of the probe level distance and the measured force to position and/or keep the lens at the controlled distanced with respect to a substrate, wherein the sensor device comprising the probe tip is carried by the object stage via a sensor stage, wherein the sensor stage comprises an actuator configured to variably set the probe level distance between a level of the probe tip and a level of the surface of the lens.

12. A method of aligning a first object at a controlled distanced (D1) with respect to a second object, the method comprising:

providing an object stage to hold the first object or the second object, wherein a surface of the first object is at a distance (D1) over a surface of the second object;

providing an object stage actuator to actuate the object stage to vary the distance (D1) between the surfaces of the first and second objects;

providing an sensor device comprising a probe tip connected at a predetermined probe level distance (Dp) relative to the surface of the first object;

using the probe tip to perform an atomic force measurement (AFM) of a force (F1) exerted via the probe tip on a surface of the second object; and controlling the object stage actuator as a function of the probe level distance (Dp) and the measured force (F1) to keep the first object at the controlled distanced (D1) with respect to a second object, wherein the sensor device comprising the probe tip is carried by the object stage via a sensor stage, wherein the sensor stage comprises an actuator configured to variably set the probe level distance (Dp) between a level of the probe tip and a level of the surface of the first object.

13. The method according to claim 12, wherein the second object is a substrate and first object is a lens for projecting images onto the substrate, wherein the images are projected by a repeated sequence including:

moving the lens relative to a surface of the substrate in a retracted position;

lowering a distance between the lens and substrate until an imaging position is reached, wherein the imaging position is determined based on the atomic force measurement of the sensor device;

projecting an image through the lens onto the substrate; and retracting the lens and/or substrate to increase the distance there between for moving to a next position.

14. The method according to claim 13, wherein the lens and/or substrate is brought from the retracted position to the imaging position by a sequence of:
- decreasing a distance (Ds) between the sensor device and the substrate until the sensor device measures a predetermined force (F1) exerted via the probe tip on the surface of the substrate; and
- keeping the distance between the sensor device and the substrate constant based a feedback of the measured force (F1) while lowering a distance between a level of the lens and a level of the sensor device until a predetermined probe level distance (Dp) corresponding to the imaging position is reached.

15. The method according to claim 14, wherein the distance between a level of the lens and a level of the sensor device is measured by an interferometric measurement of a light beam reflecting off a surface connected to the lens and a surface connected to the sensor device.

* * * * *